United States Patent
Ward et al.

(10) Patent No.: US 8,125,824 B1
(45) Date of Patent: Feb. 28, 2012

(54) NANOTUBE RANDOM ACCESS MEMORY (NRAM) AND TRANSISTOR INTEGRATION

(75) Inventors: Jonathan W. Ward, Fairfax, VA (US); Adrian N. Robinson, Haymarket, VA (US); Scott Anderson, Annadale, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/875,044

(22) Filed: Sep. 2, 2010

(51) Int. Cl.
*G11C 11/34* (2006.01)

(52) U.S. Cl. ........ 365/182; 365/151; 365/164; 365/134; 365/46; 365/148

(58) Field of Classification Search .................. 365/182, 365/151, 164, 46, 134, 148
See application file for complete search history.

(56) References Cited

U.S. PATENT DOCUMENTS

| | | | |
|---|---|---|---|
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,784,028 B2 | 8/2004 | Rueckes et al. | |
| 6,835,591 B2 | 12/2004 | Rueckes et al. | |
| 6,911,682 B2 | 6/2005 | Rueckes et al. | |
| 6,919,592 B2 | 7/2005 | Segal et al. | |
| 6,924,538 B2 | 8/2005 | Jaiprakash et al. | |
| 6,990,009 B2 | 1/2006 | Bertin et al. | |
| 7,115,901 B2 | 10/2006 | Bertin et al. | |
| 7,115,960 B2 | 10/2006 | Bertin et al. | |
| 7,259,410 B2 | 8/2007 | Jaiprakash et al. | |
| 7,335,395 B2 | 2/2008 | Ward et al. | |
| 7,365,632 B2 | 4/2008 | Bertin et al. | |
| 7,479,654 B2 | 1/2009 | Bertin et al. | |
| 7,560,136 B2 | 7/2009 | Ward et al. | |
| 7,566,478 B2 | 7/2009 | Ward et al. | |
| 7,667,999 B2* | 2/2010 | Herner et al. | 365/148 |
| 2006/0276056 A1 | 12/2006 | Ward et al. | |
| 2008/0157127 A1* | 7/2008 | Bertin et al. | 257/209 |
| 2008/0212361 A1 | 9/2008 | Bertin et al. | |
| 2008/0218210 A1 | 9/2008 | Bertin | |
| 2008/0231413 A1 | 9/2008 | Bertin et al. | |
| 2009/0154218 A1 | 6/2009 | Bertin et al. | |

(Continued)

OTHER PUBLICATIONS

Ahmad, K., et al., "Electrical conductivity and dielectric properties of multiwalled carbon nanotube and alumina composites," Applied Physics Letters, 2006, pp. 133122-1 thru 133122-3, 89, American Institute of Physics.

(Continued)

*Primary Examiner* — Fernando Hidalgo
(74) *Attorney, Agent, or Firm* — McDermott Will & Emery LLP

(57) ABSTRACT

A nanotube random access memory (NRAM) structure is provided. The structure includes a substrate, a gate electrode disposed in the substrate, and a first nanotube fabric disposed on the substrate. The first nanotube fabric has a channel region spaced apart from the gate electrode by a portion of the substrate. The structure also includes a drain contact contacting the first nanotube fabric. The structure also includes a second nanotube fabric disposed on the substrate, and is adjacent and connected to the first nanotube fabric. The structure also includes a source contact contacting the second nanotube fabric. The first nanotube fabric is a high-voltage fabric compared to the second nanotube fabric such that when a voltage is applied across the first nanotube fabric and the second nanotube fabric via the drain contact and the source contact, the second nanotube fabric is permitted to switch without switching the first nanotube fabric.

21 Claims, 15 Drawing Sheets

U.S. PATENT DOCUMENTS

2009/0194839 A1   8/2009   Bertin et al.
2010/0001267 A1   1/2010   Manning et al.
2010/0072459 A1*  3/2010   Bertin et al. .................... 257/24

OTHER PUBLICATIONS

Hassanien, a., et al., "Selective etching of metallic single-wall carbon nanotubes with hydrogen plasma," Nanotechnology, 2005, pp. 278-281, 16, Institute of Physics Publishing Ltd.

Ho, X., et al., "Scaling Properties in Transistors That Use Aligned Arrays of Single-Walled Carbon Nanotubes," Nano Letters, 2010, pp. 499-503, 10, American Chemical Society.

Waser, R., "Nanoelectronics and Information Technology: Advanced Electronic Materials and Novel Devices," 2005, p. 543, Wiley-VCH.

Zhang, G., et al., "Hydrogenation and Hydrocarbonation and Etching of Single-Walled Carbon Nanotubes," J. Am. Chem. Soc, 2006, pp. 6026-6027 and S1-S3, 128 (18) American Chemical Society.

* cited by examiner

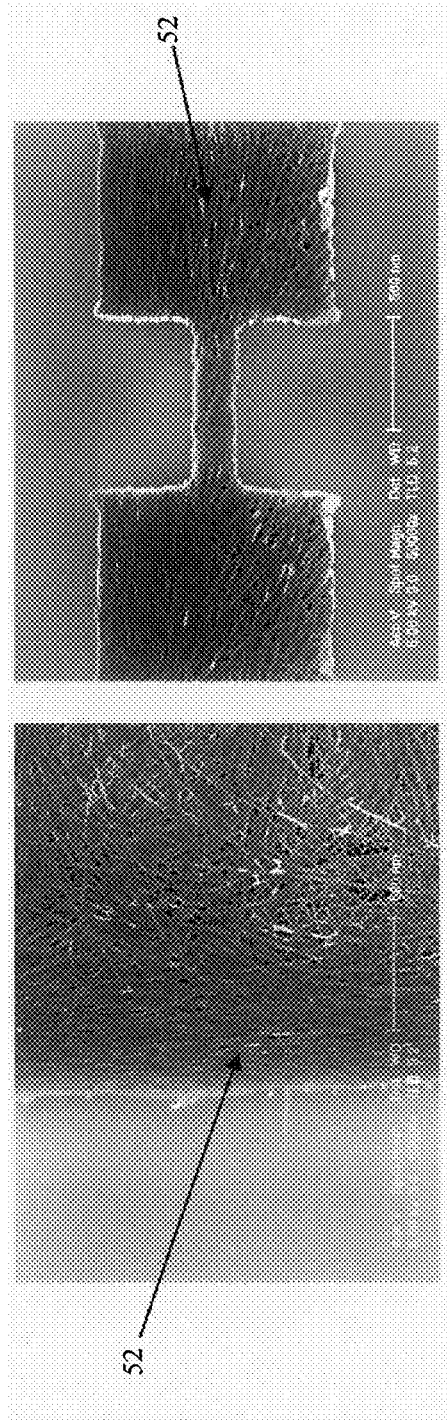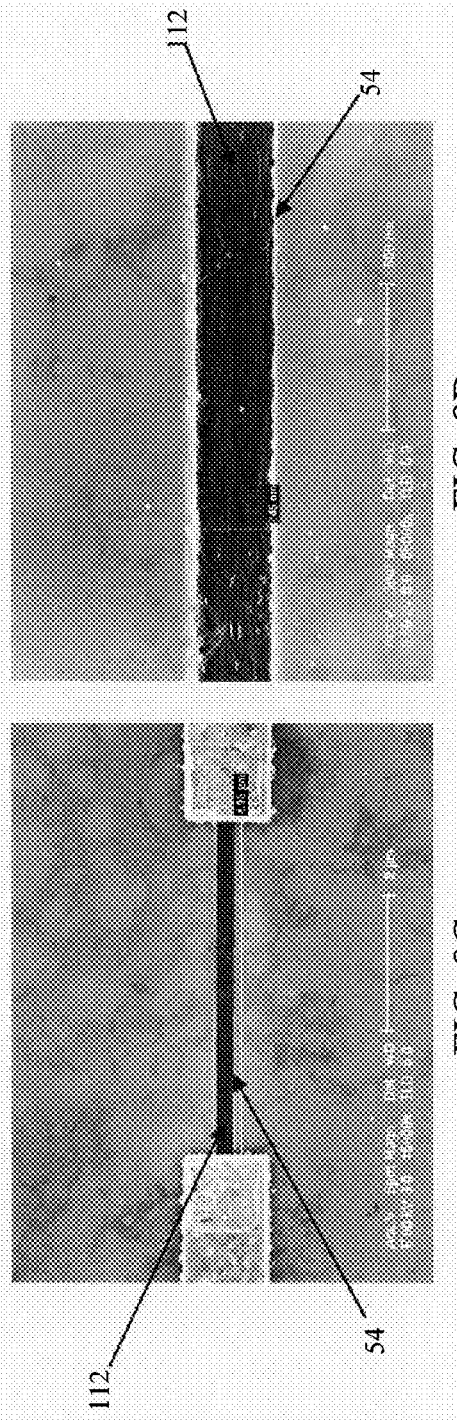
FIG. 8A
FIG. 8B
FIG. 8C
FIG. 8D

NANOTUBE RANDOM ACCESS MEMORY (NRAM) AND TRANSISTOR INTEGRATION

STATEMENT AS TO RIGHTS TO INVENTIONS MADE UNDER FEDERALLY SPONSORED RESEARCH OR DEVELOPMENT

Not Applicable.

FIELD

The present invention generally relates to nanotube random access memory and, in particular, relates to nanotube random access memory and transistor integration.

BACKGROUND

A nanotube random access memory (NRAM), which may also be referred to as a resistive nanotube memory, typically includes 1T1R devices (e.g., one transistor to one resistive memory element for each NRAM cell). Thus, at least one transistor may be used to access one particular NRAM bit. The scaling and density of NRAM may be limited by silicon transistors in terms of switching voltages and photolithography. Furthermore, because of limited silicon space, it may be difficult to form true high-density three-dimensional (3-D) NRAM arrays. In particular, because of underlying silicon transistors or diodes, it may be difficult to form high-density 3-D stacked NRAM arrays.

SUMMARY

According to various aspects of the subject technology, an NRAM may be integrated with high voltage carbon nanotube (CNT) field-effect transistors (FETs), permitting the formation of 3-D NRAM arrays with improved densities and reduced capacitance (which may reduce power requirements and improve operation speeds). In some aspects, a monolayered nanotube fabric may be integrated with a multilayered nanotube fabric to form a device in which the monolayered nanotube fabric forms an NRAM portion of the device while the multilayered nanotube fabric forms the CNT FET portion of the device. In some aspects, the multilayered nanotube fabric may withstand higher voltages (and hence current) than the monolayered nanotube fabric, thereby permitting switching of the NRAM portion of the device without switching of the CNT FET portion of the device.

According to various aspects of the subject technology, an NRAM structure comprises a first substrate and a first gate electrode disposed in the first substrate. The structure also comprises a first nanotube fabric disposed on the first substrate. The first nanotube fabric has a channel region spaced apart from the first gate electrode by a first portion of the first substrate. The structure also comprises a first drain contact contacting the first nanotube fabric. The structure also comprises a second nanotube fabric disposed on the first substrate and adjacent the first nanotube fabric. The second nanotube fabric is connected to the first nanotube fabric. The module also comprises a first source contact contacting the second nanotube fabric. The first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

According to various aspects of the subject technology, a method for forming an NRAM structure is provided. The method comprises providing a first substrate, providing a first drain contact, providing a first source contact, and providing a first gate electrode. The gate electrode is disposed in the first substrate. The method also comprises providing a first nanotube fabric disposed on the first substrate and connected to the first drain contact. The method also comprises providing a second nanotube fabric. The second nanotube fabric is disposed on the first substrate and adjacent the first nanotube fabric. The second nanotube fabric is connected to the first nanotube fabric and connected to the first source contact. The first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

According to various aspects of the subject technology, a method for operating an NRAM structure is provided. The method comprises applying a voltage to a first gate electrode disposed in a first substrate of the NRAM structure to increase conduction in a channel region. The channel region is in a first nanotube fabric disposed on the first substrate. The channel region is spaced apart from the first gate electrode by a first portion of the first substrate. A second nanotube fabric is disposed on the first substrate. The second nanotube fabric is adjacent to and connected to the first nanotube fabric. The method also comprises applying a voltage across the first nanotube fabric and the second nanotube fabric via a first drain contact contacting the first nanotube fabric and a first source contact contacting the second nanotube fabric such that the second nanotube fabric is switched without switching the first nanotube fabric.

According to various aspects of the subject technology, an NRAM cell comprises a first substrate and a first gate electrode disposed in the first substrate. The NRAM cell also comprises a first nanotube fabric disposed on the first substrate. The first nanotube fabric is spaced apart from the first gate electrode by a first portion of the first substrate. The NRAM cell also comprises a first drain contact disposed on the first nanotube fabric. The first drain contact comprises a portion aligned with a portion of the first gate electrode. The NRAM cell also comprises a second nanotube fabric disposed on the first substrate and adjacent the first nanotube fabric. The second nanotube fabric is connected to the first nanotube fabric. An amount of metallic nanotubes in the first nanotube fabric is less than an amount of metallic nanotubes in the second nanotube fabric. The NRAM cell also comprises a first source contact contacting the second nanotube fabric. The NRAM cell also comprises a first bridge contact disposed on the first nanotube fabric and the second nanotube fabric. The first bridge contact comprises a portion aligned with a portion of the first gate electrode. The first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

Additional features and advantages of the subject technology will be set forth in the description below, and in part will be apparent from the description, or may be learned by practice of the subject technology. The advantages of the subject technology will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

FIGS. 8A, 8B, 8C, and 8D illustrate examples of aligned nanotubes, in accordance with various aspects of the subject technology.

DETAILED DESCRIPTION

In the following detailed description, numerous specific details are set forth to provide a full understanding of the subject technology. It will be apparent, however, to one ordinarily skilled in the art that the subject technology may be practiced without some of these specific details. In other instances, well-known structures and techniques have not been shown in detail so as not to obscure the subject technology.

According to various aspects of the subject technology, a CNT FET may be integrated with an NRAM device to form a stackable NRAM cell. An array of NRAM cells that are stacked together may form an NRAM module with higher packing densities and reduced capacitance. In some aspects, stacking the NRAM arrays may permit lower power and higher speed (e.g., write and read times) for the NRAM module compared to standard architectures that are not stackable. Combining CNT FETs with NRAM devices may also improve ease of fabrication/manufacturing. One difficulty, however, with integrating CNT FETs with NRAM devices is that voltages utilized to switch a particular NRAM device may also cause a corresponding CNT FET to switch with similar characteristics as the NRAM device (e.g., voltages utilized to switch the NRAM device may also cause the corresponding CNT FET to switch like the NRAM device rather than switching as a transistor). According to various aspects of the subject technology, a CNT FET may be integrated with an NRAM device to form an NRAM cell such that when a voltage is applied across both the CNT FET and the NRAM device, the NRAM device is permitted to switch without switching the CNT FET.

Figure 1:
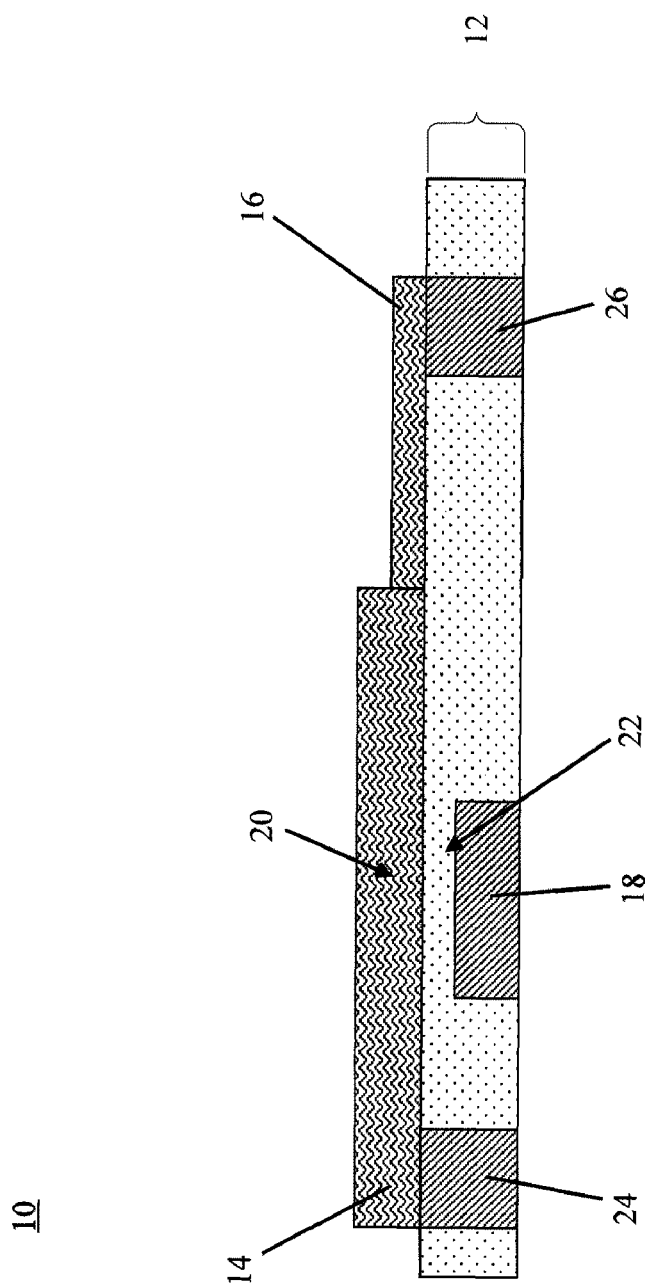
FIG. 1 illustrates a cross-sectional view of an NRAM cell, in accordance with various aspects of the subject technology.

FIG. 1 illustrates a cross-sectional view of NRAM cell 10, in accordance with various aspects of the subject technology. NRAM cell 10 comprises substrate 12 and gate electrode 18 (e.g., a metal electrode), which is disposed in substrate 12. Substrate 12 may comprise an insulating material such as $SiO_2$, $SiN_x$, $HfO_2$, HfAlO, HfSiO, $TiO_2$, $Al_2O_3$ (crystalline and non-crystalline), MgO, other suitable metal oxides, or other suitable material. NRAM cell 10 also comprises nanotube fabric 14 disposed on substrate 12. Nanotube fabric 14 forms the CNT FET portion of NRAM cell 10, which may be selected through gate electrode 18. As shown in FIG. 1, gate electrode 18 is disposed underneath and insulated from a middle portion of nanotube fabric 14. In some aspects, nanotube fabric 14 may also be referred to as a CNT FET fabric. Deposition of nanotube fabric 14 may be achieved by any suitable technique such as spray coating, spin coating, dip coating, etc. Nanotube fabric 14 includes channel region 20 spaced apart from gate electrode 18 by portion 22 of substrate 12. NRAM memory cell 10 also comprises drain contact 24 (e.g., a metal contact) contacting nanotube fabric 14. As shown in FIG. 1, drain contact 24 is disposed in substrate 12 and contacts a leftmost end portion of nanotube fabric 14.

According to certain aspects, NRAM cell 10 also comprises nanotube fabric 16 disposed on substrate 12 and adjacent nanotube fabric 14. For example, nanotube fabric 16 and nanotube fabric 14 are connected and in direct contact. Nanotube fabric 16 forms the NRAM device of NRAM cell 10. After deposition and patterning of nanotube fabric 14, nanotube fabric 16 may then be deposited and patterned to form the NRAM device of NRAM cell 10. In some aspects, nanotube fabric 16 may also be referred to as an NRAM fabric. NRAM cell 10 also comprises source contact 26 (e.g., a metal contact) contacting nanotube fabric 16. As shown in FIG. 1, source contact 26 is disposed in substrate 12 and contacts a rightmost end portion of nanotube fabric 16. Although gate electrode 18, drain contact 24, and source contact 26 are shown in FIG. 1 as disposed in substrate 12 in their respective regions, each of these electrode/contacts may be disposed in other regions relative to nanotube fabric 14 and/or nanotube fabric 16 provided that voltage may flow across nanotube fabric 14 and nanotube fabric 16 between source contact 26 and drain contact 24 when gate electrode 18 is gated. In some aspects, gate electrode 18, drain contact 24, and source contact 26 may be made of at least one of Al, Cu, W, Al (less than 1% Cu), Co, Ti, Ta, W, Ni, Mo, Pd, Pt, TiW, Ru, $CoSi_x$, $WSi_2$, $TiSi_x$, TaN, TiN, TiAlN, RuN, RuO, PtSi, $Pd_2Si$, $MoSi_2$, $NiSi_x$, Ag, Au, Au/Ti, Bi, Ca, Cr, Cr/Au, Fe, In, Ir, Mg, Na, Ni, $NiSi_2$, Os, Pb, Rh, RhSi, Sb, Sn, Pb/Sn, PbIn, Zn, $ZrSi_2$, and other suitable material.

Typical write "0" voltages for a particular NRAM bit may be 8-10 volts with 20-500 nanosecond (ns) pulse widths.

Typical write "1" voltages for a particular NRAM bit may be 3-6 volts with greater than 1 microsecond pulse widths. In some aspects, as the thickness of a nanotube fabric is increased, resistance of the nanotube fabric is decreased. Thus, the voltages needed to switch a thicker nanotube fabric is significantly increased compared to a nanotube fabric that is not as thick. For example, a thickness of the nanotube fabric may be increased (e.g., greater than or equal to about 20 nanometers) such that voltages greater than 15 volts are needed to switch the thicker nanotube fabric from "0" to "1" and vice versa. Using this concept, a CNT FET may be integrated with an NRAM device such that when a voltage is applied across the CNT FET and the NRAM device, the NRAM device is permitted to switch without switching the CNT FET. In other words, the thickness of nanotube fabric 16 is less than the thickness of nanotube fabric 14 such that when a voltage is applied across nanotube fabric 14 and nanotube fabric 16 via drain contact 24 and source contact 26, nanotube fabric 16 (the NRAM device) is permitted to switch without switching nanotube fabric 14 (the CNT FET portion). In some aspects, applying a voltage to gate electrode 18 will not switch nanotube fabric 16. In some aspects, if nanotube fabric 14 is not gated on, nanotube fabric 16 will also not switch. In some aspects, nanotube fabric 16 may be monolayered while nanotube fabric 14 may be multilayered. Because nanotube fabric 14 is thicker than nanotube fabric 16, a higher source-drain voltage would be used to switch nanotube fabric 14 than nanotube fabric 16. For this reason, nanotube fabric 14 may be referred to as a high-voltage (relative to nanotube fabric 16) CNT FET fabric.

The subject technology is not limited to employing thicker nanotube fabrics for the CNT FET portion. In some aspects, a wider nanotube fabric 14 (relative to nanotube fabric 16) can be employed instead of a thicker nantoube fabric 14 (relative to nanotube fabric 16). For example, the width of nanotube fabric 16 may be less than the width of nanotube fabric 14 such that when a voltage is applied across nanotube fabric 14 and nanotube fabric 16 via drain contact 24 and source contact 26, nanotube fabric 16 is permitted to switch without switching nanotube fabric 14. In some aspects, nanotube fabric 16 and nanotube fabric 14 may each be either mono-layered or multilayered provided that when a voltage is applied across nanotube fabric 14 and nanotube fabric 16 via drain contact 24 and source contact 26, nanotube fabric 16 is permitted to switch without switching nanotube fabric 14.

In one aspect of the subject technology, nanotube fabric 14 is a high-voltage fabric as compared to nanotube fabric 16. Stated in another way, nanotube fabric 14 has a lower resistance than nanotube fabric 16 such that when a voltage is applied across nanotube fabric 14 and nanotube fabric 16 via the drain contact and source contact, nanotube fabric 16 is permitted to switch without switching nanotube fabric 14 (i.e., a higher voltage is required to switch nanotube fabric 14 in comparison to nanotube fabric 16). In one aspect, the physical or electrical characteristics are different between nanotube fabric 14 and nanotube fabric 16 to provide different switching characteristics.

To access the NRAM device (e.g., nanotube fabric 16) of NRAM cell 10, the CNT FET (e.g., nanotube fabric 14) may be selected through gate electrode 18, turning the CNT FET into either a voltage high or a voltage low state. If the CNT FET is turned into a voltage high state, a high voltage (current) pulse may be forced through channel region 20 of nanotube fabric 14, switching the NRAM device to either "0" or "1" depending on its initial state. The state of the NRAM device may be read using source contact 26, for example, by measuring the current flowing through nanotube fabric 16 and calculating the resistance of nanotube fabric 16. If the resistance is high (e.g., greater than 1 mega-ohm), then the NRAM device is in a "0" state. If the resistance is low (e.g., between 100 ohms to 1 mega-ohm), then the NRAM device is in a "1" state.

Figure 2:
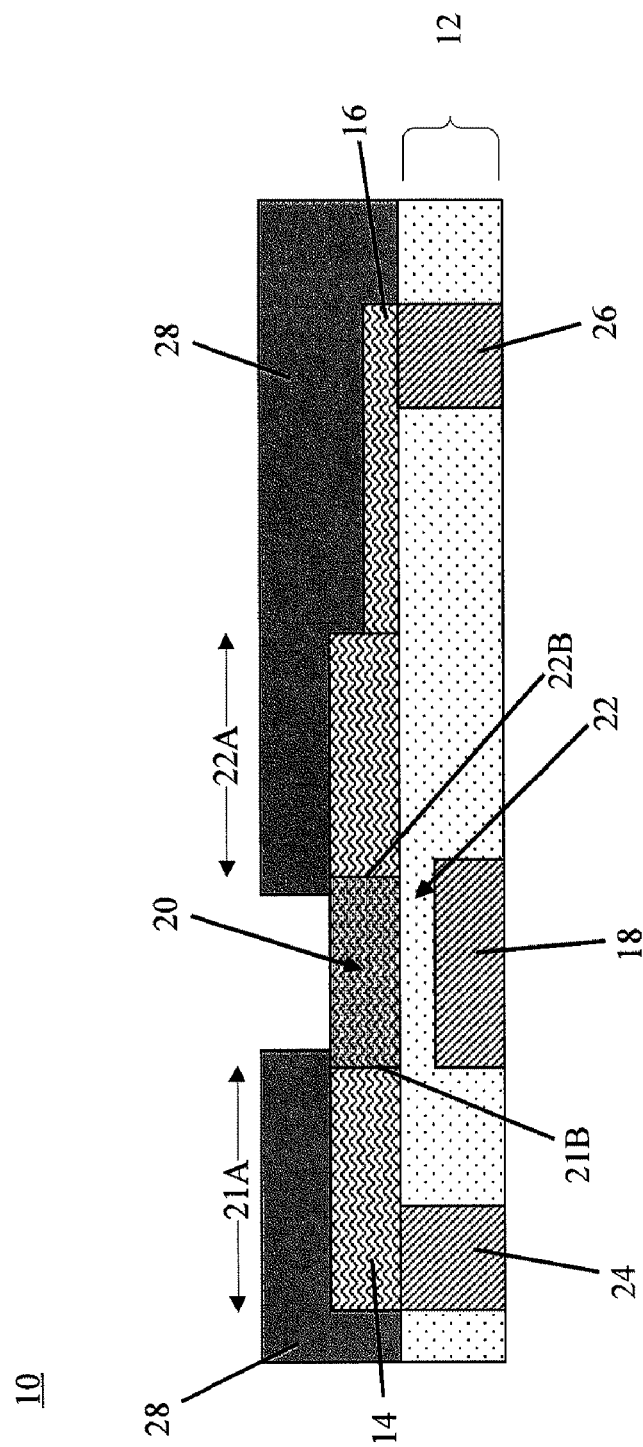
FIG. 2 illustrates a cross-sectional view of an NRAM cell under a selective etching operation, in accordance with various aspects of the subject technology.

FIG. 2 illustrates a cross-sectional view of NRAM cell 10 under a selective etching operation, in accordance with various aspects of the subject technology. In some aspects, channel region 20 may be etched to remove metallic nanotubes from nanotube fabric 14 for improving the switching characteristics of nanotube fabric 14. In particular, removing metallic nanotubes from nanotube fabric 14 may ensure that current/voltage does not flow across nanotube fabric 14 when channel region 20 of nanotube fabric 14 is gated off (e.g., nanotube fabric 14 is in a voltage low state). Thus, channel region 20 is highly resistive. When an "on" voltage is applied to gate electrode 18, channel region 20 can become more conductive, allowing current to flow through nanotube fabric 14 (e.g., nanotube fabric 14 is in a voltage high state).

In some aspects, channel region 20 may be etched with a downstream plasma in a hydrogen environment to remove the metallic nanotubes. For example, argon and hydrogen gas (e.g., in concentrations between 20% and 80% of $H_2$) may be introduced into an environment such as a tube furnace at flow rates between 100-400 standard cubic centimeters per minute (sccm) and at a pressure between 250-500 milli-Torr (mTorr). The tube furnace may be operated at 400°-800° Celsius with a sample placed at a position inside a process tube in the heated region (e.g., inside the tube furnace). A radio frequency (RF) plasma at about 13.56 megahertz may be ignited using inductive coils upstream of an inlet to the tube furnace at a power between 25-100 watts. In some aspects, channel region 20 may be exposed for upwards of 10 minutes of plasma followed by 20 minutes of annealing at 600° Celsius in a background gas flow of $H_2$. Although this etching process has been described with $H_2$, other suitable hydrogen containing gases may also be used such as methane.

In some aspects, a photoresist layer or hard mask layer 28 may be used to protect regions of nanotube fabric 14 and nanotube fabric 16 during the selective etching process. Thus, only the regions not protected by photoresist layer or hard mask layer 28 (e.g., channel region 20 which is directly above gate electrode 18) are selectively etched to remove metallic nanotubes. Selectively etching channel region 20 (above gate electrode 18) may permit high conduction of nanotube fabric 14 in regions 21A and 22A up to the etch boundaries 21B and 22B (i.e., areas of nanotube fabric 14 that are not above gate electrode 18, or the areas of nanotube fabric 14 that are protected by the photoresist layer or hard mask layer 28). Although FIG. 2 shows that channel region 20 is selectively etched, other regions of nanotube fabric 14 and/or nanotube fabric 16 may be also be selectively etched. For example, the entirety of nanotube fabric 14 may be selectively etched to remove metallic nanotubes.

Figure 3:
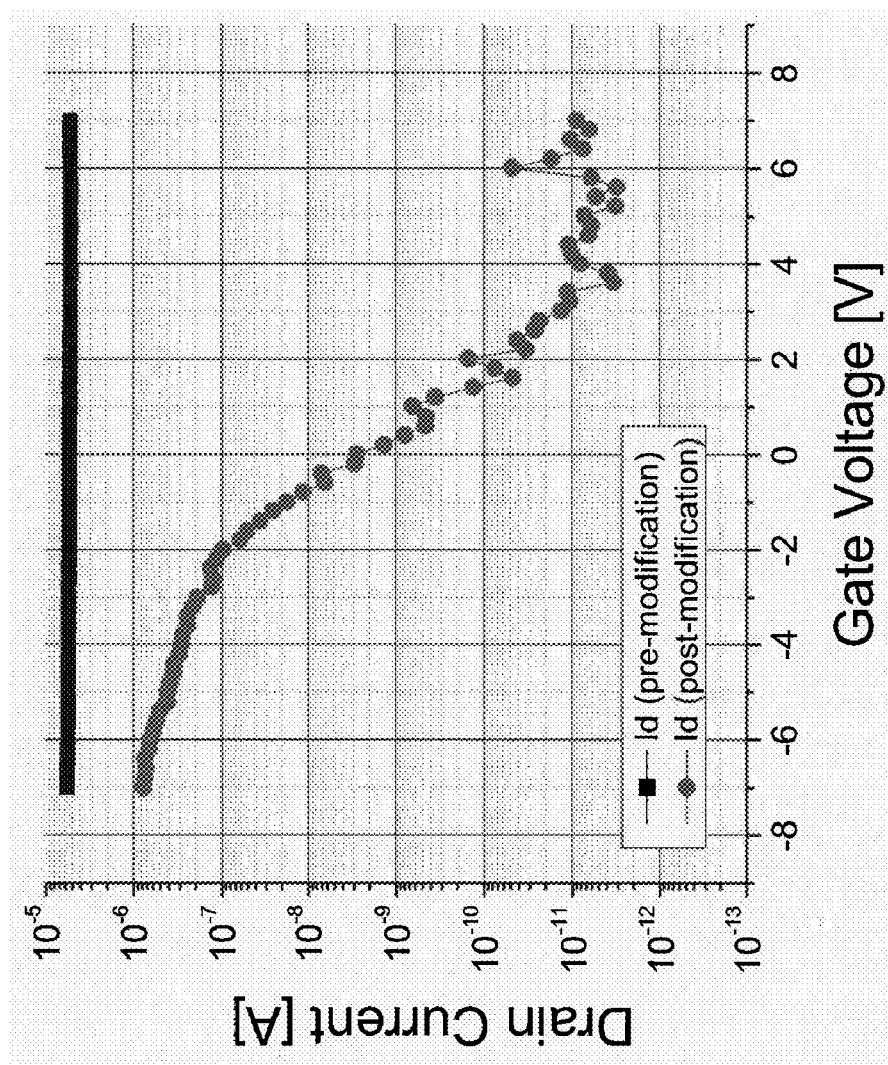
FIG. 3 is a graph illustrating current versus voltage characteristics of a CNT FET portion of an NRAM cell, in accordance with various aspects of the subject technology.

FIG. 3 is a graph illustrating current (Id-s) versus voltage (Vg) characteristics of nanotube fabric 14 (e.g., the CNT FET portion of NRAM cell 10), in accordance with various aspects of the subject technology. The current represented in the graph is current flowing through nanotube fabric 14, while the voltage represented in the graph is voltage applied to gate electrode 18 for gating the CNT FET portion of NRAM cell 10. The top curve illustrates the current versus voltage characteristics of nanotube fabric 14 without any region of nanotube fabric 14 being selectively etched, while the bottom curve illustrates the current versus voltage characteristics of nanotube fabric 14 after channel region 20 is selectively etched, as described with respect to FIG. 2. In some aspects, nanotube fabric 14 is considered to be gated "on" when the voltage is around −6 volts (e.g., in the leftmost portions of the two curves). In some aspects, nanotube fabric 14 is considered to be gated "off" when the voltage is around 6 volts (e.g., in the rightmost portions of the two curves). However, nanotube fabric 14 may be considered to be gated "on" or "off" based on other suitable voltages depending on the application and configuration of nanotube fabric 14. The current when nanotube fabric 14 is gated "on" may be referred to as "$I_{on}$." The current when nanotube fabric 14 is gated "off" may be referred to as "$I_{off}$." As shown by the two curves in FIG. 3, selectively etching channel region 20 provides a greater $I_{on}/I_{off}$ ratio (e.g., the bottom curve). In some aspects, by employing the selective etching process as described with respect to FIG. 2, $I_{on}/I_{off}$ ratios of between 10,000/1 and 1,500,000/1 may be achieved. In contrast, when the selective etching process is not used, the $I_{on}/I_{off}$ ratio may typically be less than 36/1 (e.g., shown by the top curve).

Figure 4:
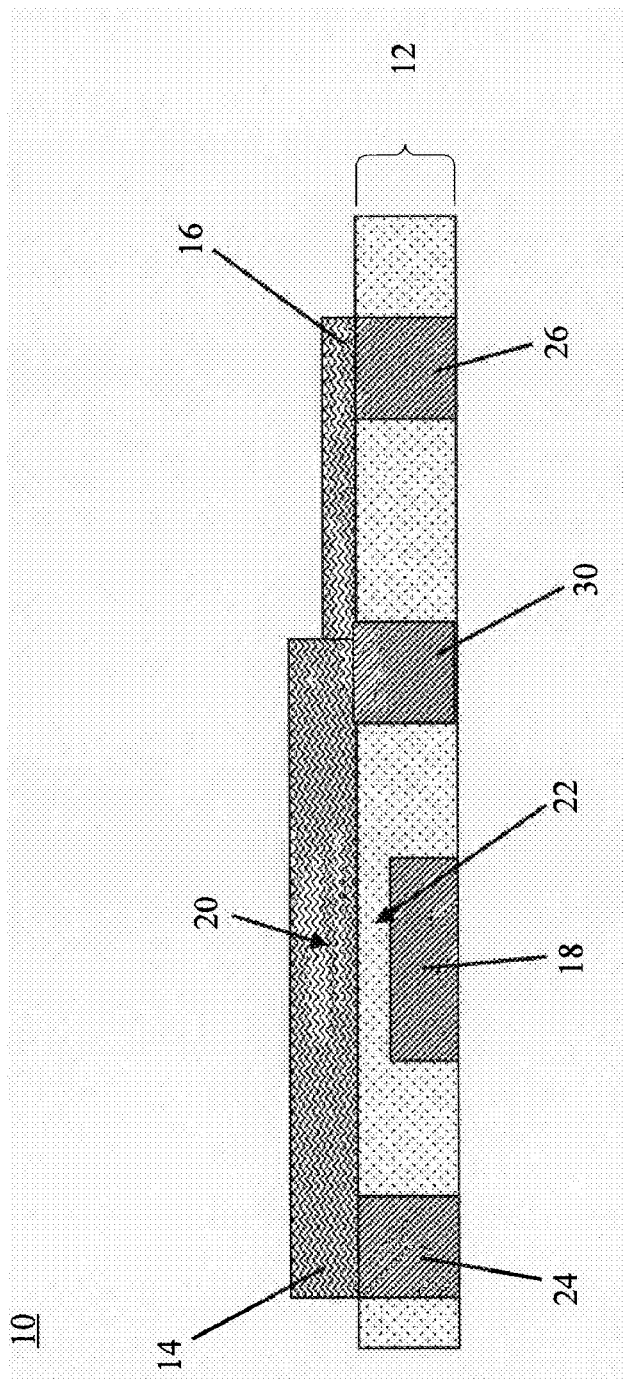
FIG. 4 illustrates a cross-sectional view of an NRAM cell, in accordance with various aspects of the subject technology.

FIG. 4 illustrates a cross-sectional view of NRAM cell 10, in accordance with various aspects of the subject technology. As shown in FIG. 4, NRAM cell 10 comprises bridge contact 30 (e.g., a metal contact) disposed in substrate 12, which contacts both nanotube fabric 14 and nanotube fabric 16. By employing bridge contact 30, contact resistance between nanotube fabric 14 and nanotube fabric 16 may be reduced. Furthermore, employing bridge contact 30 may prevent inadvertent NRAM-characteristic switching at the interface between nanotube fabric 14 and nanotube fabric 16.

Figure 5:
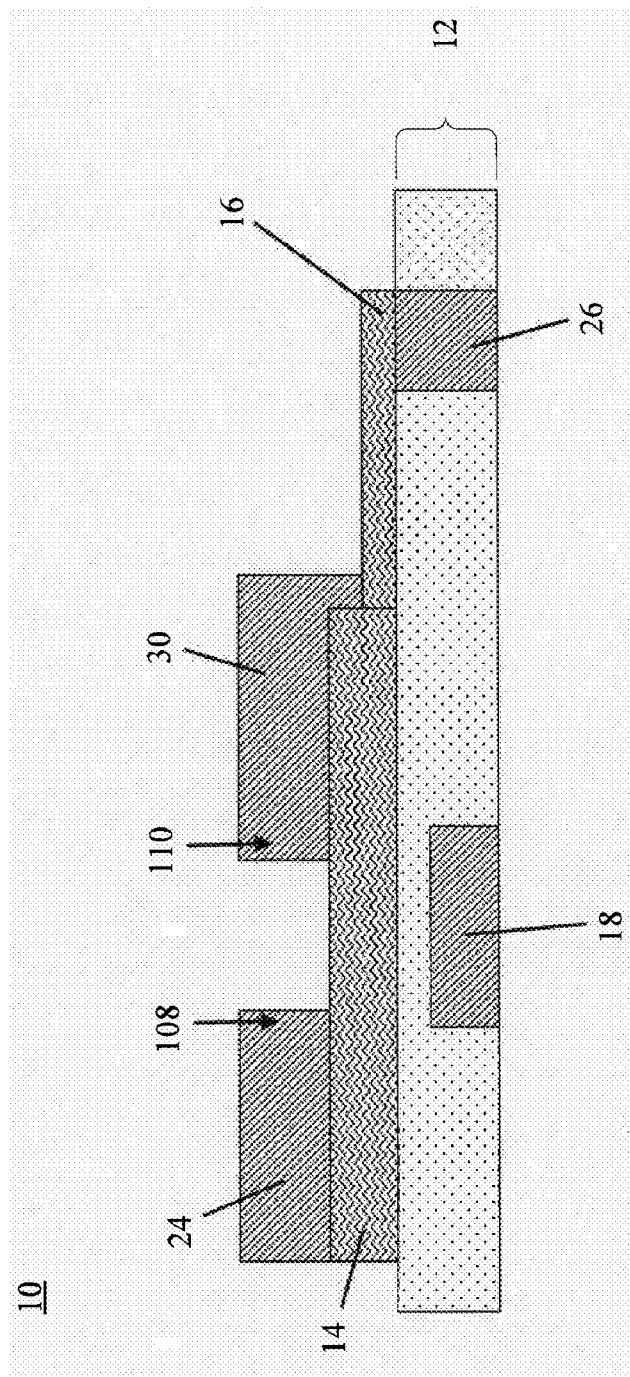
FIG. 5 illustrates a cross-sectional view of an NRAM cell, in accordance with various aspects of the subject technology.

FIG. 5 illustrates a cross-sectional view of NRAM cell 10, in accordance with various aspects of the subject technology. As shown in FIG. 5, drain contact 24 is disposed on nanotube fabric 14, while bridge contact 30 is disposed on both nanotube fabric 14 and nanotube fabric 16. Furthermore, bridge contact 30 is extended such that it comprises a portion 110 aligned with and overlapping a portion of gate electrode 18. Drain contact 24 is also extended such that it comprises a portion 108 aligned with and overlapping a portion of gate electrode 18. This configuration of NRAM cell 10, shown in FIG. 5, may be useful when nanotube fabric 14 has been entirely etched to remove metallic nanotubes. The extension of drain contact 24 and bridge contact 30 over gate electrode 18 may ensure that all of the semiconducting nanotubes in nanotube fabric 14 can be gated for effective switching of the CNT FET portion of NRAM cell 10.

Figure 6:
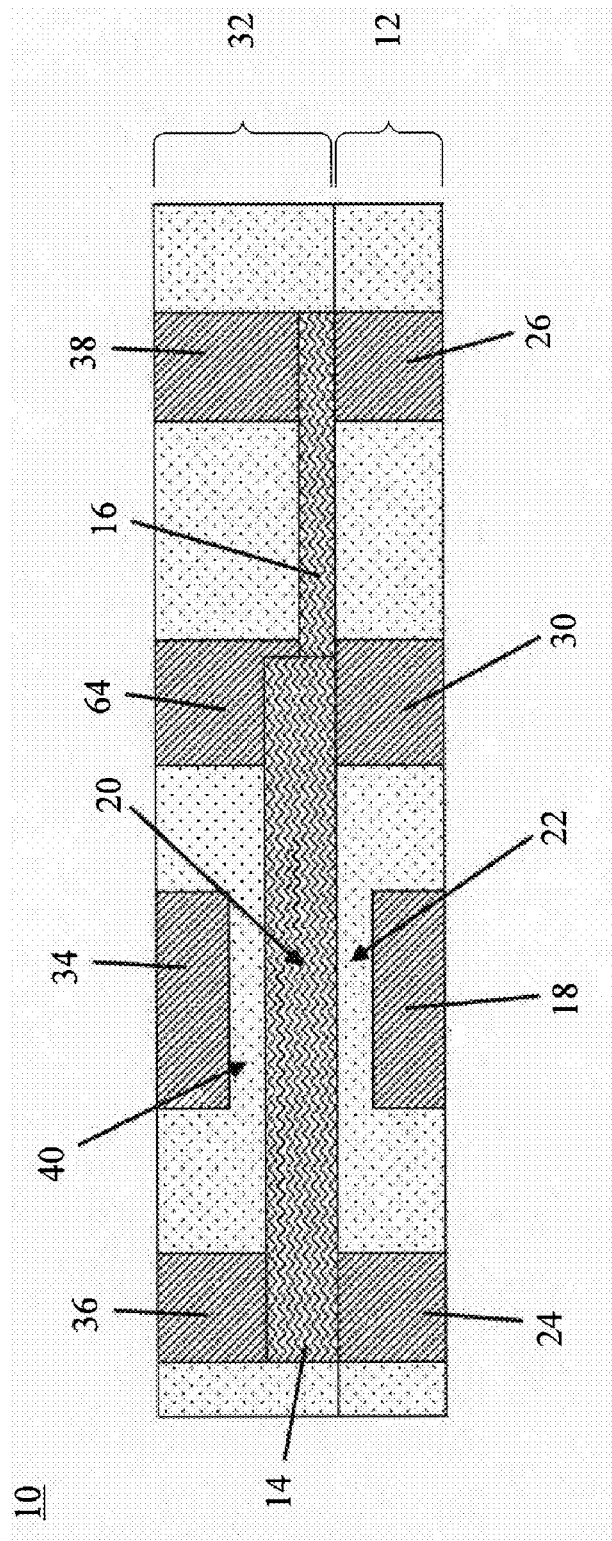
FIG. 6 illustrates a cross-sectional view of an NRAM cell, in accordance with various aspects of the subject technology.

FIG. 6 illustrates a cross-sectional view of NRAM cell 10, in accordance with various aspects of the subject technology. As shown in FIG. 6, NRAM cell 10 may comprise a second substrate 32 (e.g., an upper layer composed of a material that is the same or similar to the material of substrate 12) disposed on or over nanotube fabric 14 and nanotube fabric 16. NRAM cell 10 further comprises a second gate electrode 34 disposed in substrate 32, which is aligned with gate electrode 18. By including gate electrode 34, nanotube fabric 14 may be gated more effectively. Gate electrode 34 may also be referred to as a surround gate. Channel region 20 is spaced apart from gate electrode 34 by portion 40 of substrate 32.

Furthermore, NRAM cell 10 comprises additional metal contacts disposed opposite of drain contact 24, bridge contact 30, and source contact 26 for effectively lowering contact resistance. For example, NRAM cell 10 further comprises a second drain contact 36, which is disposed in substrate 32, contacts nanotube fabric 14, and is aligned with drain contact 24. NRAM cell 10 also comprises a second source contact 38, which is disposed in substrate 32, contacts nanotube fabric 16, and is aligned with source contact 26. NRAM cell 10 further comprises a second bridge contact 64, which is disposed in substrate 32, contacts both nanotube fabric 14 and nanotube fabric 16, and is aligned with bridge contact 30.

According to various aspects of the subject technology, NRAM cell 10 may be passivated with an insulating material such as silicon dioxide ($SiO_2$) or other suitable material. However, semiconducting processing techniques to deposit silicon dioxide may not be compatible with CNTs. The oxidizing environments may damage/etch a nanotube fabric. Atomic layer deposition (ALD) can be employed to deposit high-k dielectric material as a gate oxide. However, this technique may not be sufficient as a field oxide. Thus, according to various aspects of the subject technology, a passivation layer may be formed by depositing a thin silicon nitride layer to protect nanotube fabric 14 and/or nanotube fabric 16, before deposition of the field oxide to isolate NRAM cell 10. In some aspects, substrate 32 comprises a silicon nitride layer on or over nanotube fabric 14 and nanotube fabric 16. Substrate 32 may also comprise a silicon dioxide layer disposed on the silicon nitride layer.

Figure 7B:
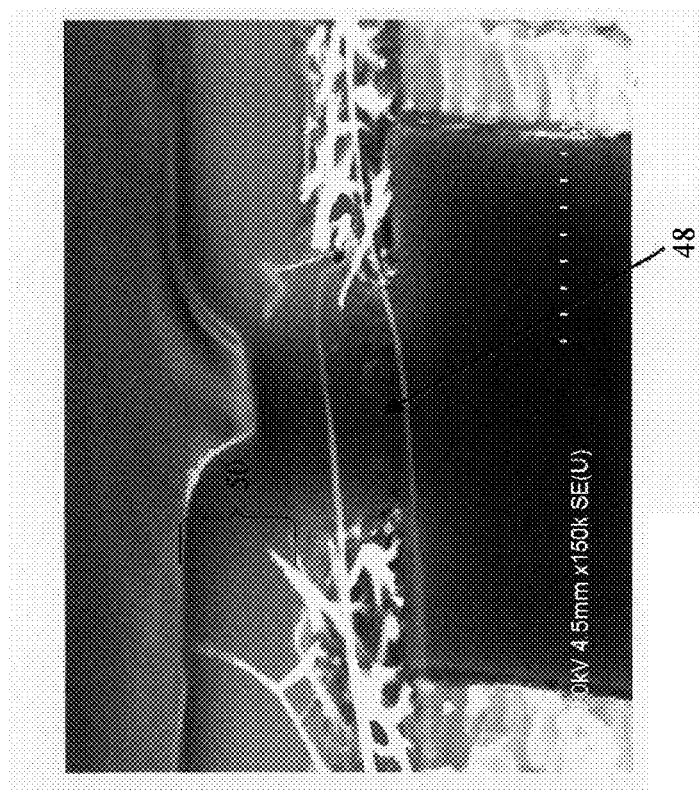
FIGS. 7A and 7B are scanning electron microscope (SEM) images of an example of a multilayer nanotube fabric that was passivated, in accordance with various aspects of the subject technology.
Figure 7A:
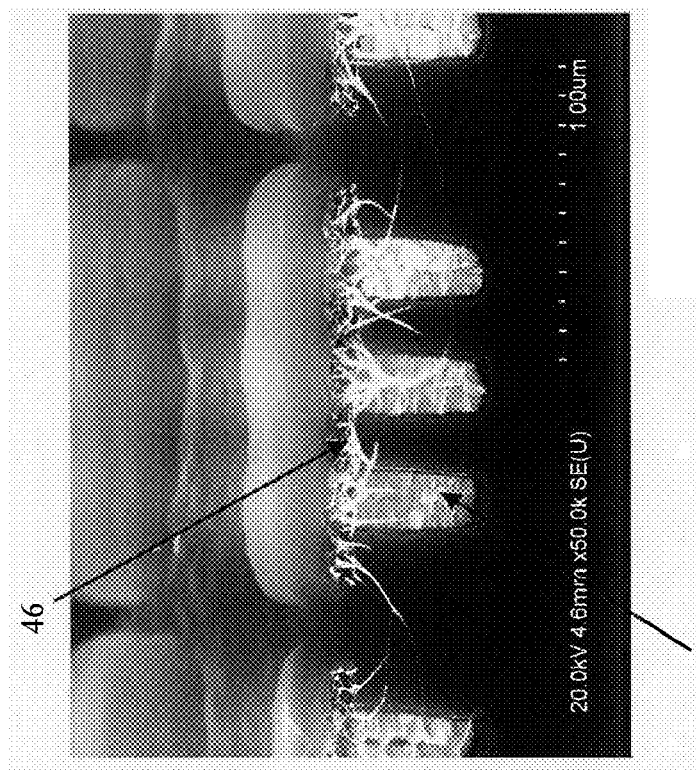

FIGS. 7A and 7B are scanning electron microscope (SEM) images of an example of a multilayer nanotube fabric 46 that was passivated, in accordance with various aspects of the subject technology. FIG. 7A illustrates nanotube fabric 46 having tungsten electrodes 42. As shown in FIG. 7B, nanotube fabric 46 is passivated with a 200 Angstrom silicon nitride layer 48 and then isolated with a thicker 1500 Angstrom oxide layer 50. The thickness of silicon nitride layer 48 and oxide layer 50 is not limited to these dimensions, and may be of other suitable dimensions. In some aspects, there may be no electrical change in resistance of nanotube fabric 46 before and after deposition of silicon nitride layer 48 and oxide layer 50. Thus, the ability to passivate nanotube fabrics (e.g., nanotube fabric 14 and nanotube fabric 16) may negate the need for secondary passivation, such as hermitic sealing, or the need for non-standard complementary metal oxide semiconductor (CMOS) integration, such as the utilization of polymers, which may present difficulties with process integration. In some aspects, the ability to passivate nanotube fabrics may allow the formation of stacked CNT FET and NRAM devices.

According to various aspects of the subject technology, nanotube fabrics may be substantially aligned (e.g., to form aligned nanotube fabrics) to reduce resistance and scattering within the nanotube fabrics. For example, at least 50% of nanotubes in nanotube fabric 14 may be substantially aligned to reduce resistance and reduce scattering within the CNT FET portion of NRAM cell 10, which may improve high frequency operation. In some aspects, at least 75% of nanotubes in nanotube fabric 14 may be substantially aligned. In some aspects, at least 90% of nanotubes in nanotube fabric 14 may be substantially aligned. The greater amount of nanotubes that can be aligned, the greater the reduction in resistance and scattering within the nanotube fabrics. FIGS. 8A, 8B, 8C, and 8D illustrate examples of aligned nanotubes, in accordance with various aspects of the subject technology. FIG. 8A illustrates an example of a nanotube fabric 52 that was partially aligned. A substantially aligned nanotube fabric 52 (e.g., shown in FIG. 8B) was then patterned from the aligned portion of nanotube fabric 52 shown in FIG. 8A. FIGS. 8C and 8D illustrate an example of a nanotube fabric 112 in which aligned nanotubes of nanotube fabric 112 are formed within trench 54 in an oxide substrate, and then subsequently contacted with metal electrodes.

Figure 9A:
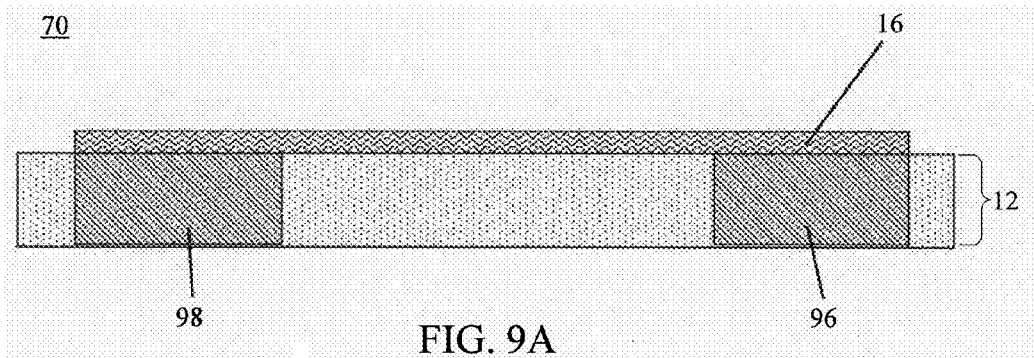
FIGS. 9A, 9B, 9C, 9D, 9E, and 9F illustrate a method of passivating and stacking NRAM cells to form an NRAM module, in accordance with various aspects of the subject technology.
Figure 9B:
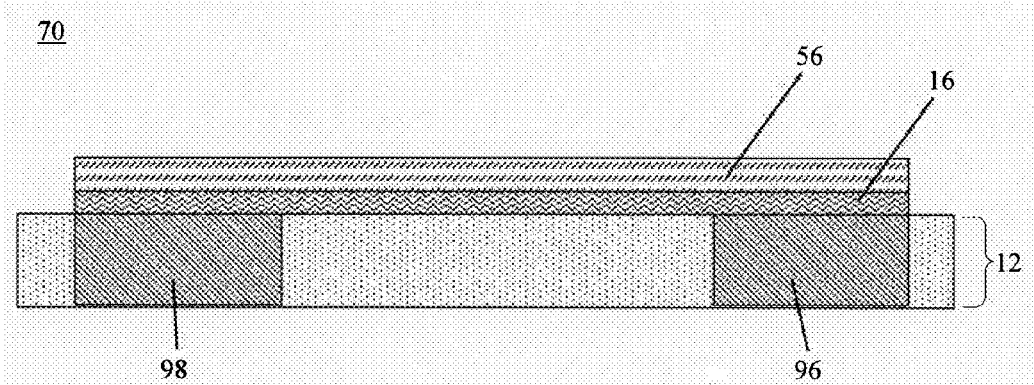

FIGS. 9A, 9B, 9C, 9D, 9E, and 9F illustrate a method of passivating and stacking NRAM cells to form NRAM module 70, in accordance with various aspects of the subject technology. For simplicity, only the NRAM device (e.g., nanotube fabric 16) of an NRAM cell is illustrated, but the methods described with respect to these figures are readily applicable to an entire NRAM cell including the CNT FET portion (e.g., nanotube fabric 14). FIG. 9A illustrates nanotube fabric 16 disposed on substrate 12, with metal contacts 96 and 98 disposed in substrate 12. Metal contacts 96 and 98 may represent drain, bridge, source, and/or gate electrodes that may be used in forming an NRAM cell of NRAM module 70. As shown in FIG. 9B, a sacrificial layer 56 is deposited and patterned on top of nanotube fabric 16. Sacrificial layer 56 may later be removed to form a cavity above nanotube fabric 16 (e.g., for switching of nanotube fabric 16 between "0" and "1" states). However, if the cavity is not desired, a protective layer (e.g., the silicon nitride layer as described with respect to FIGS. 6, 7A, and 7B) may be used in place of sacrificial layer 56. Sacrificial layer 56 may comprise at least one of silicon, tungsten, aluminum, and any other suitable material that does not damage nanotube fabric 16 and can be removed with a high isotropic vapor phase or reactive ion etch such as, but not limited to, xenon difluoride ($XeF_2$) without altering the properties of the CNT fabric. Although other materials can be employed for sacrificial layer 56 with the utilization of wet etches, high capillary forces may prevent effective removal of sacrificial layer 56 once encapsulated.

Figure 9C:
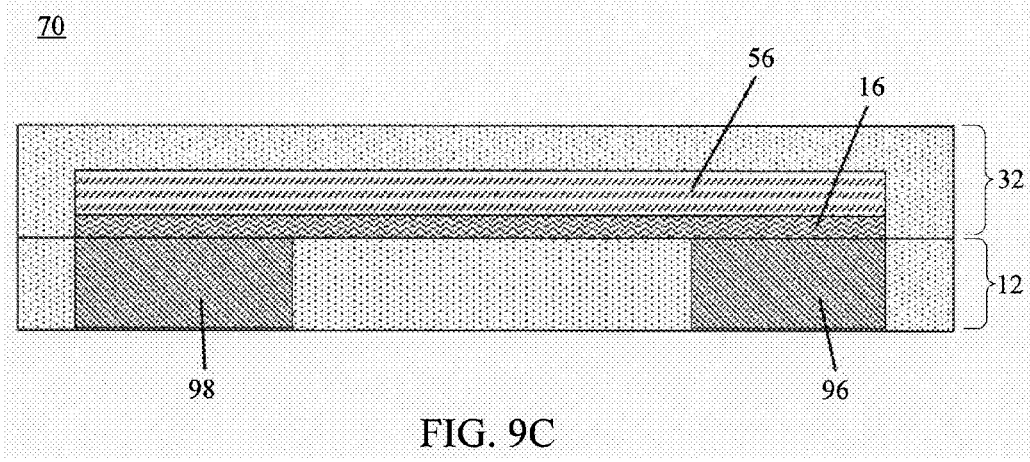
Figure 9D:
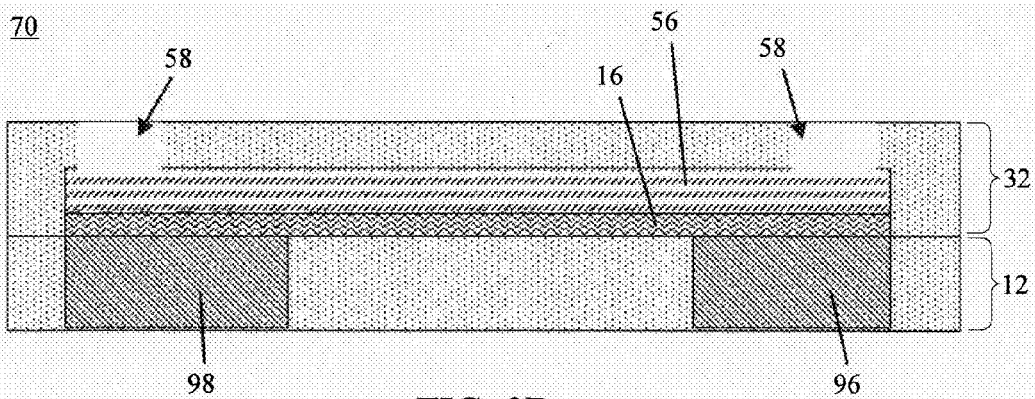
Figure 9E:
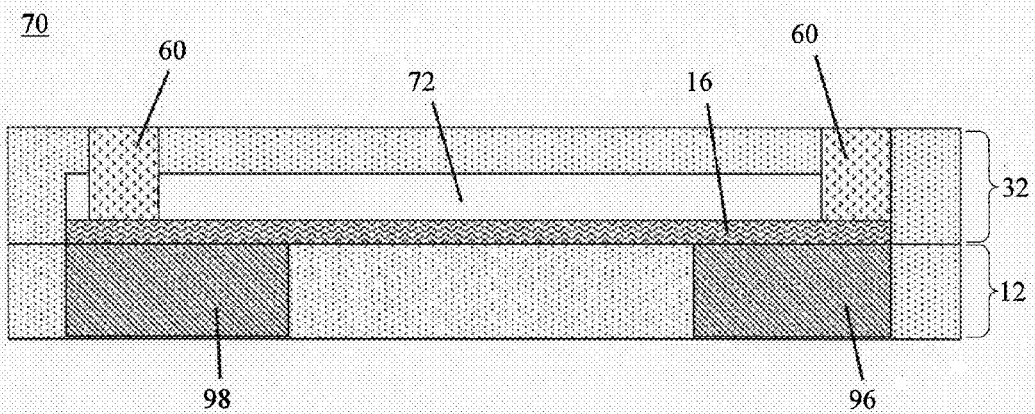
Figure 9F:
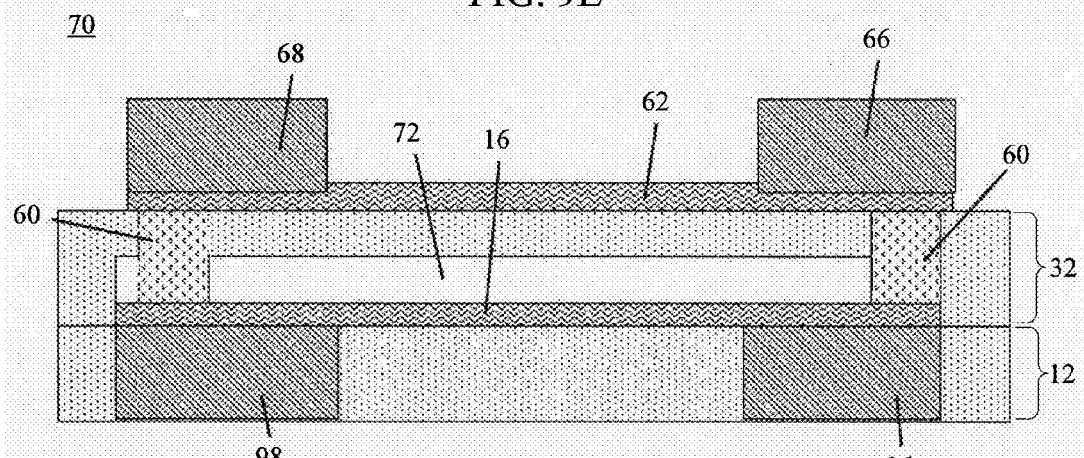

As shown in FIG. 9C, an encapsulating insulator (e.g., an encapsulating oxide) may be deposited over sacrificial layer 56 to form substrate 32. To planarize the encapsulating insulator, a chemical mechanical polish (CMP) can be employed. Vias 58 may be etched into the encapsulating insulator to expose sacrificial layer 56, as shown in FIG. 9D. In some aspects, if the protective layer is employed instead of sacrificial layer 56, then vias 58 may be etched selectively down to nanotube fabric 16 (not shown). As shown in FIG. 9E, after opening vias 58, sacrificial layer 56 may then be removed, thereby forming cavity 72 over nanotube fabric 16. Vias 58 may be filled with either conductor or insulator 60, depending on desired electrical path. In some aspects, CNT circuits may be designed such that a nanotube fabric (e.g., nanotube fabric 16) and vias 58 may be extended beyond an active region of NRAM cell 10 to prevent damage to the active region. Once integration of the bottom NRAM structure is complete (e.g., as shown in FIG. 9E), a stacked NRAM structure can then be created by depositing and patterning a second nanotube fabric 62 onto substrate 32 and applying appropriate metal contacts to nanotube fabric 62, such as metal contacts 66 and 68, as shown in FIG. 9F.

Figure 10:
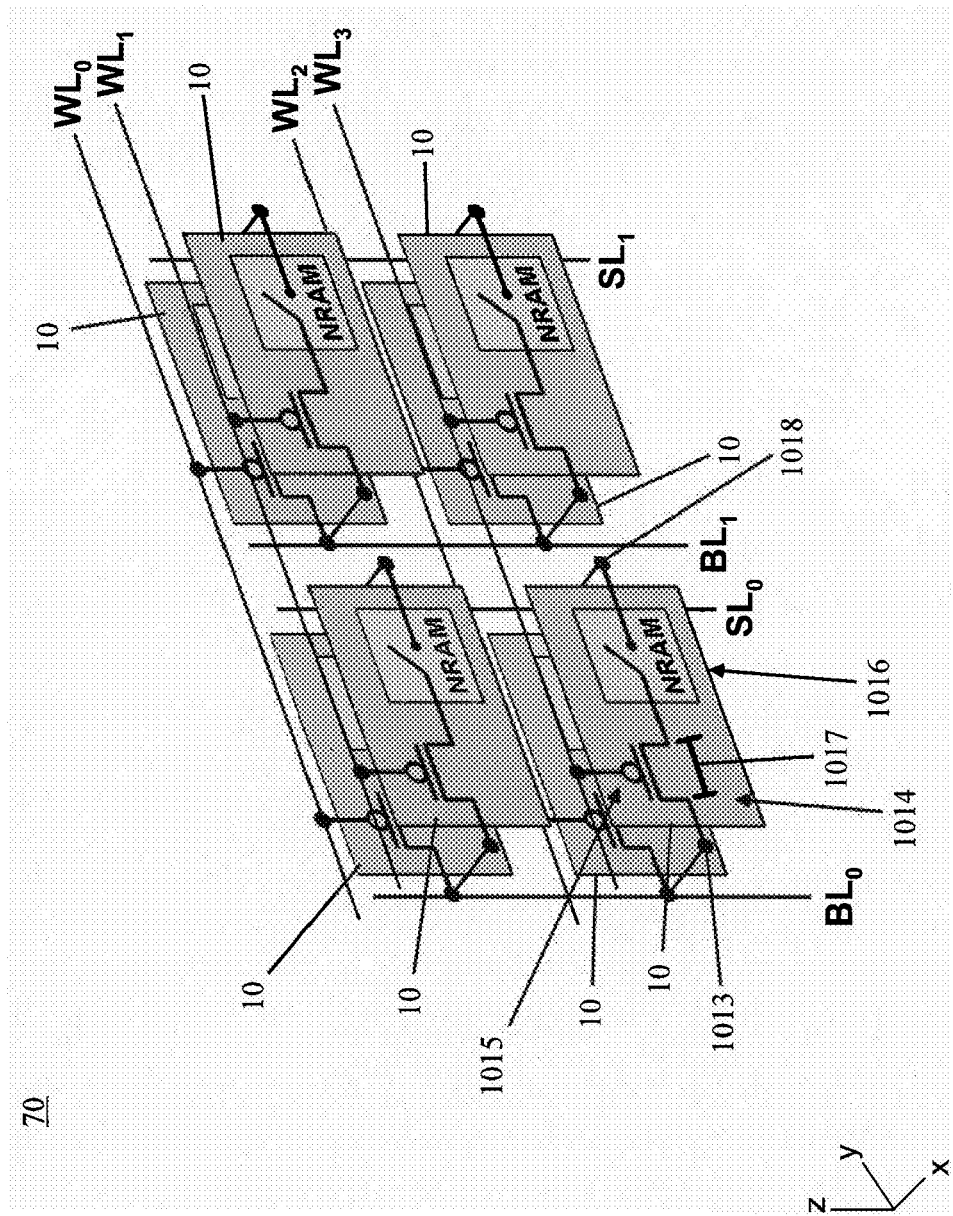
FIG. 10 illustrates a schematic of an NRAM module, in accordance with various aspects of the subject technology.

FIG. 10 illustrates a schematic of NRAM module 70, in accordance with various aspects of the subject technology. Each NRAM cell 10 includes a CNT FET 1014 and an NRAM device 1016. A plurality of NRAM cells 10 may be stacked into layers to form NRAM module 70. In other words, a plurality of NRAM cells 10 may form an NRAM array in the x-y direction, and a plurality of NRAM arrays may be stacked in the z-direction to form NRAM module 70. For example, as shown in FIG. 10, NRAM cells 10 are stacked in a 2×2×2 configuration. In some aspects, a larger number or a smaller number of NRAM cells 10 may be stacked together in either the x-, y-, and/or z-direction. In some aspects, the drain contacts of NRAM cells 10 may be connected to form bit lines (BLs), which may run vertically along the z-direction between the stacked layers, as shown in FIG. 10 as $BL_0$ and $BL_1$, and also connect NRAM cells 10 along the x-direction. In some aspects, the source contacts of NRAM cells 10 may be connected to form source lines (SLs), which may run vertically along the z-direction between the stacked layers, as shown in FIG. 10 as $SL_0$ and $SL_1$, and also connect NRAM cells 10 along the x-direction. SLs may also be referred to as read lines for allowing access to a particular NRAM device 1016 of an NRAM cell 10 for reading the state of the NRAM device. In some aspects, the gate electrodes of NRAM cells 10 may be connected to form word lines (WLs), which may run along the y-direction, as shown in FIG. 10 as $WL_0$, $WL_1$, $WL_2$, and $WL_3$. The WLs also connect a specific row of NRAM cells 10 (which may be implemented in a cross-point array). Thus, by using the configuration of NRAM module 70 shown in FIG. 10, a particular NRAM cell 10 may be selected for a writing, reading, or erasing operation by specifying a particular BL, SL, and WL.

In some aspects, compared to a single layer of NRAM cells 10, the stackable configuration of NRAM cells 10 beneficially allows for an increase in density and a reduction in capacitance. For example, a single layer comprising 256 NRAM cells 10 may need an area equal to 256 times the size of a single NRAM cell 10. Furthermore, the BLs and the SLs of the single layer of NRAM cells 10 may have a wire capacitance equal to 256 times the capacitance of a single NRAM cell 10. By stacking the NRAM cells 10 in two layers (e.g., two layers of 128 NRAM cells 10), the area is reduced by half, allowing for twice as many NRAM cells 10 in the same area. The capacitance is also nearly reduced by half, allowing for an increase in performance and reduction in power. The stackable configuration of NRAM cells 10 may be extended to any number of additional layers, with each layer further reducing the area and capacitance on the BLs and the SLs. In some aspects, by stacking two layers of NRAM cells, 250 nanometer (nm) CMOS technology can be employed to obtain 90 nm device densities. Higher densities can further be obtained with additional stacking of NRAM cells 10.

Referring to FIGS. 1 and 10, in one aspect, gate 1015 of CNT FET 1014 may correspond to gate electrode 18 in FIG. 1, drain 1013 may correspond to drain contact 24 in FIG. 1, a region 1017 may correspond to nanotube fabric 14. NRAM device 1016 may correspond to nanotube 16 in FIG. 1, and source 1018 may correspond to source contact 26 in FIG. 1.

Figure 11:
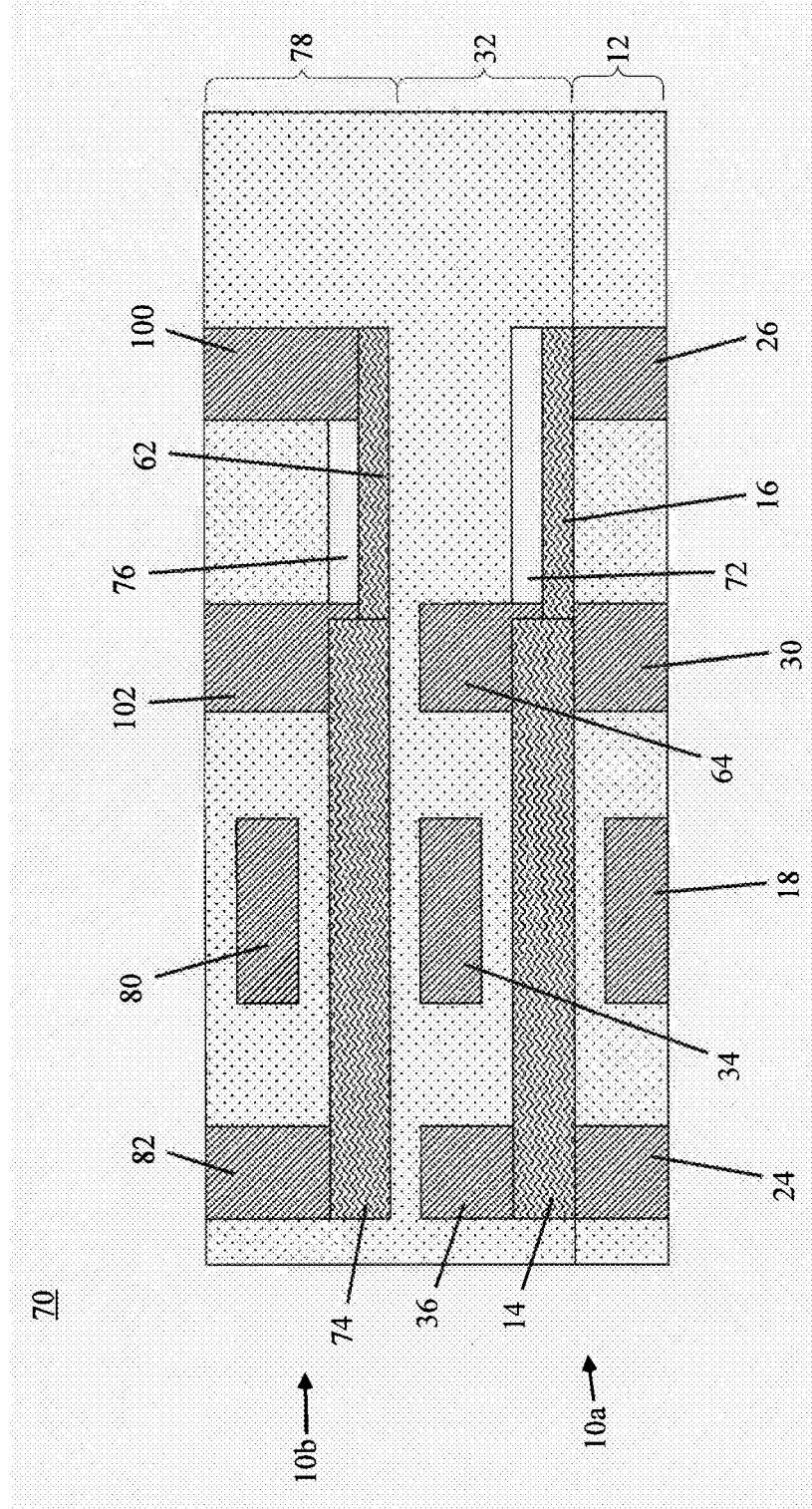
FIG. 11 illustrates a cross-sectional view of an NRAM module, in accordance with various aspects of the subject technology.

FIG. 11 illustrates a cross-sectional view of NRAM module 70, in accordance with various aspects of the subject technology. NRAM module 70 may comprise one or more NRAM cells 10 stacked on top of one another. For example, as shown in FIG. 11, NRAM cell 10b may be stacked on top of NRAM cell 10a. NRAM cell 10a is in the same configuration as NRAM cell 10 in FIG. 6, except that cavity 72 is defined in substrate 32 over nanotube fabric 16 instead of having source contact 38 disposed in substrate 32 and contacting nanotube fabric 16.

NRAM cell 10b comprises nanotube fabric 74 disposed on substrate 32. Nanotube fabric 74 forms the CNT FET portion of NRAM cell 10b. NRAM cell 10b also comprises nanotube fabric 62 disposed on substrate 32 and adjacent nanotube fabric 74. Nanotube fabric 62 forms the NRAM device of NRAM cell 10b. NRAM cell 10b also comprises substrate 78 disposed on or over nanotube fabric 74 and nanotube fabric 62. NRAM cell 10b also comprises: drain contact 82 disposed in substrate 78 and contacting nanotube fabric 74; gate electrode 80 disposed in substrate 78 and spaced apart from nanotube fabric 74 by a portion of substrate 78; bridge contact 102 disposed in substrate 78 and contacting nanotube fabric 74 and nanotube fabric 62; and source contact 100 disposed in substrate 78 and contacting nanotube fabric 62. Cavity 76 is defined in substrate 78 over nanotube fabric 62. In some aspects, a thickness of nanotube fabric 62 is less than a thickness of nanotube fabric 74 such that when a voltage is applied across nanotube fabric 74 and nanotube fabric 62 via drain contact 82 and source contact 100, nanotube fabric 62 is permitted to switch without switching nanotube fabric 74.

Figure 12:
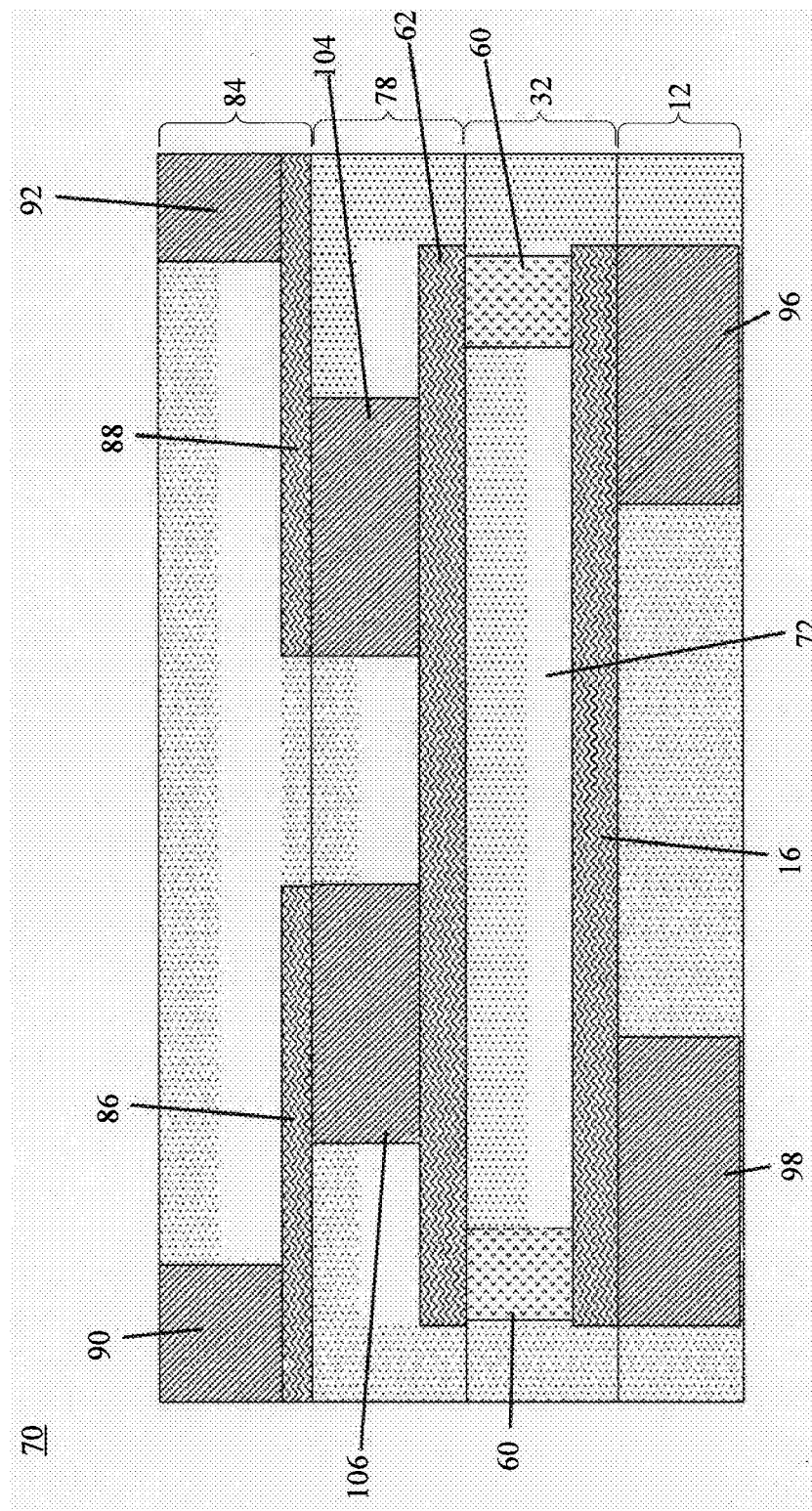
FIG. 12 illustrates a cross-sectional view of an NRAM module, in accordance with various aspects of the subject technology.

FIG. 12 illustrates a cross-sectional view of NRAM module 70, in accordance with various aspects of the subject technology. In some aspects, multiple stacked layers and circuit configurations can be created as shown in FIG. 12 where three device layers may be produced. For example, in the first layer, nanotube fabric 16 is disposed on substrate 12, and metal contacts 96 and 98 are disposed in substrate 12 and contact nanotube fabric 16. In the second layer, substrate 32 is formed on or over nanotube fabric 16, and nanotube fabric 62 is disposed on substrate 32. Cavity 72 is formed over nanotube fabric 16, while metal contacts 106 and 104 are disposed on nanotube fabric 62. Conductor or insulators 60 may couple nanotube fabric 16 to nanotube fabric 62. In the third layer, substrate 78 is formed on or over nanotube fabric 62, and nanotube fabrics 86 and 88 are disposed on substrate 78. Metal contact 106 contacts nanotube fabric 86 while metal contact 104 contacts nanotube fabric 88. An additional metal contact 90 may be disposed on nanotube fabric 86 while an additional metal contact 92 may be disposed on nanotube fabric 88. An additional substrate 84 may be formed on or over nanotube fabric 86 and nanotube fabric 88. In some aspects, the nanotube fabrics in FIG. 12 may be employed as NRAM devices or as CNT FET portions. In some aspects, the metal contacts shown in FIG. 12 may be employed as drain, source, or bridge contacts.

Figure 13:
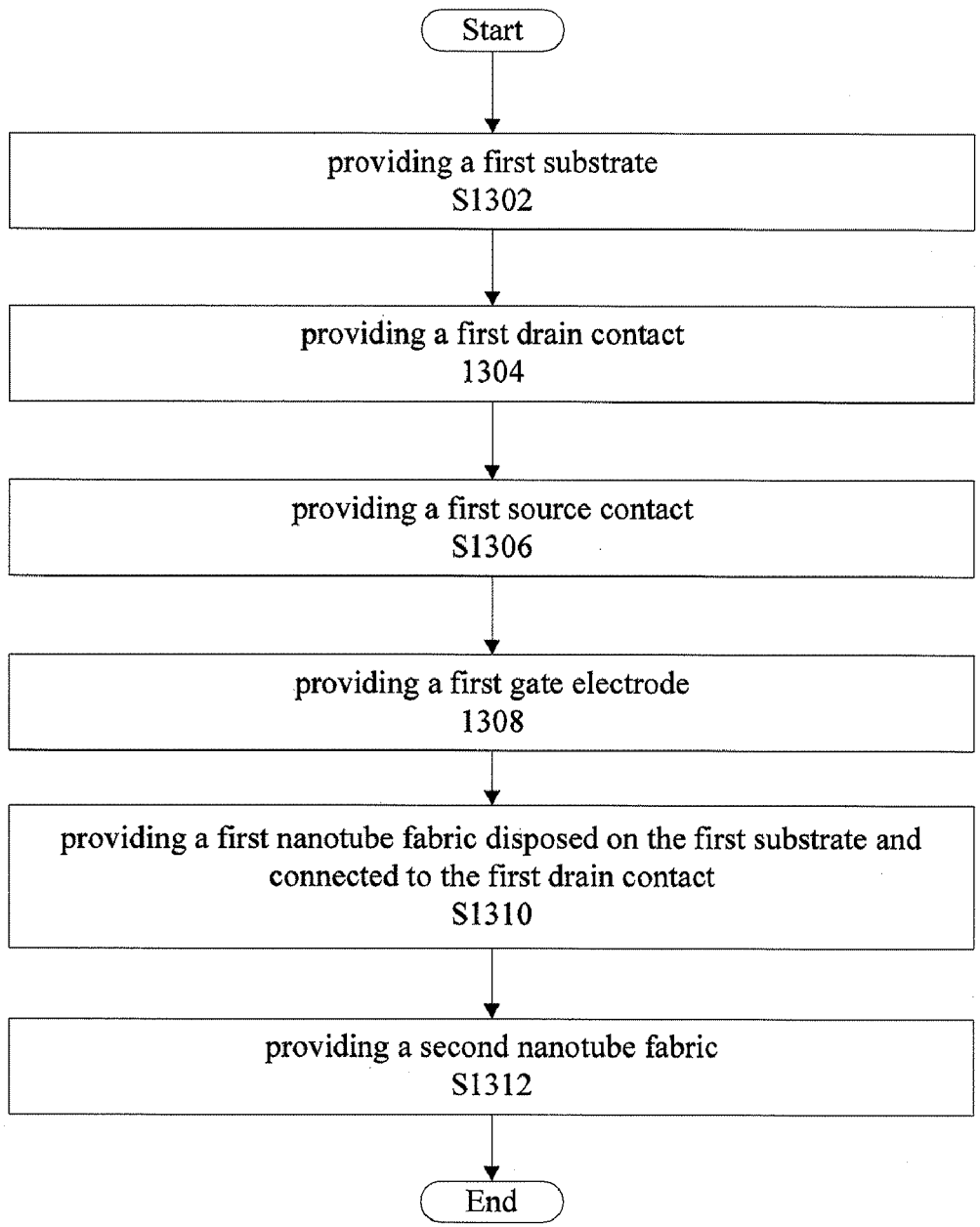
FIG. 13 illustrates a method for forming an NRAM structure, in accordance with various aspects of the subject technology.

FIG. 13 illustrates method 1300 for forming an NRAM structure, in accordance with various aspects of the subject technology. Method 1300 comprises providing a first substrate (S1302), providing a first drain contact (S1304), providing a first source contact (S1306), and providing a first gate electrode (S1308). The gate electrode is disposed in the first substrate. Method 1300 also comprises providing a first nanotube fabric disposed on the first substrate and connected to the first drain contact (S1310). Method 1300 also comprises providing a second nanotube fabric (S1312). The second nanotube fabric is disposed on the first substrate and adjacent the first nanotube fabric. The second nanotube fabric is connected to the first nanotube fabric and connected to the first source contact. The first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

Figure 14:
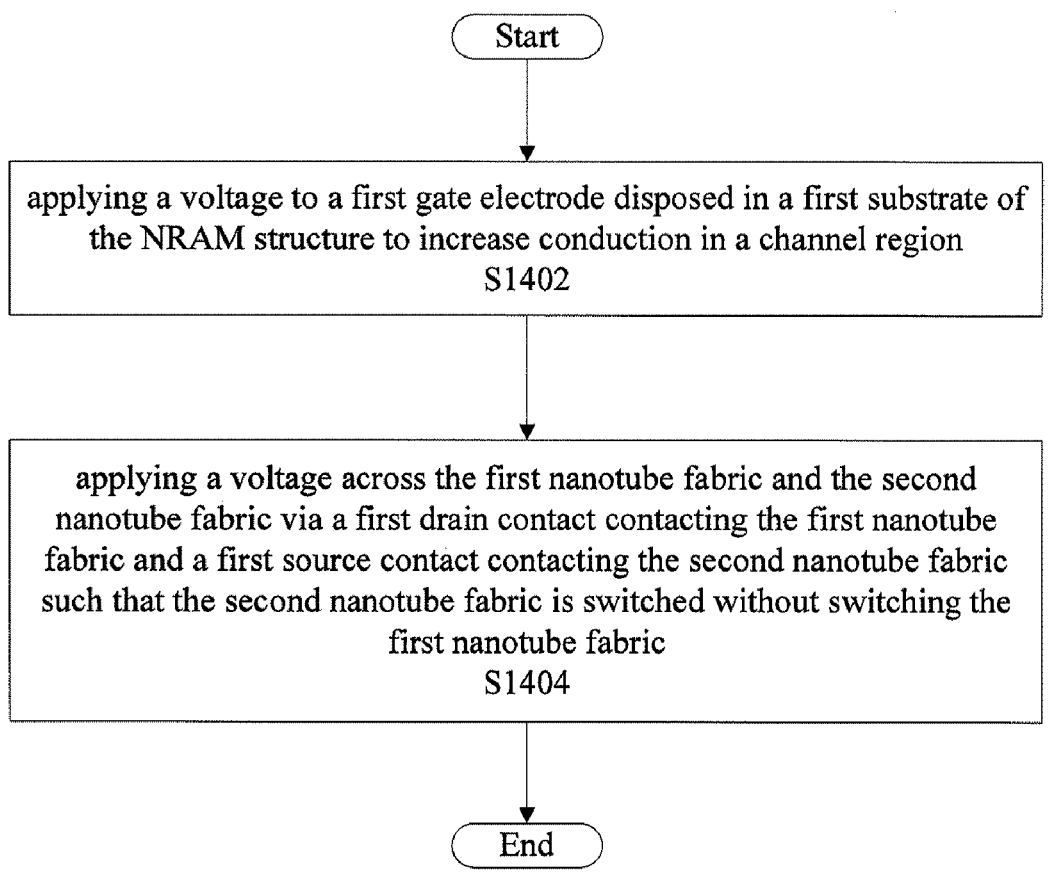
FIG. 14 illustrates a method for operating an NRAM structure, in accordance with various aspects of the subject technology.

FIG. 14 illustrates method 1400 for operating an NRAM structure, in accordance with various aspects of the subject technology. Method 1400 comprises applying a voltage to a first gate electrode disposed in a first substrate of the NRAM structure to increase conduction in a channel region (S1402). The channel region is in a first nanotube fabric disposed on the first substrate. The channel region is spaced apart from the first gate electrode by a first portion of the first substrate. A second nanotube fabric is disposed on the first substrate. The second nanotube fabric is adjacent to and connected to the first nanotube fabric. Method 1400 also comprises applying a voltage across the first nanotube fabric and the second nanotube fabric via a first drain contact contacting the first nanotube fabric and a first source contact contacting the second nanotube fabric such that the second nanotube fabric is switched without switching the first nanotube fabric (S1404).

In some aspects, the subject technology may be used in various markets, including for example and without limitation, information assurance markets, memory/data storage markets, and semiconductor markets.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these configurations will be readily apparent to those skilled in the art, and generic principles defined herein may be applied to other configurations. Thus, many changes and modifications may be made to the subject technology, by one having ordinary skill in the art, without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented. The orders of the steps may occur simultaneously or in different orders. For example, the formation of drain contact 24 and source contact 26 may occur simultaneously. Nanotube fabric 14 and nanotube fabric 16 may be initially deposited simultaneously with the same thickness, and the extra thickness over the area of nanotube fabric 16 may be etched away. Alternatively, nanotube fabric 14 and nanotube fabric 16 may be initially deposited simultaneously with the same thicknes, and the extra thickness over the area of nanotube fabric 14 may be added. Alternatively, nanotube fabric 14 and nanotube fabric 16 may be formed separately and/or sequentially.

Terms such as "top," "bottom," "front," "rear," "left", "right," "side" and the like as used in this disclosure should be understood as referring to an arbitrary frame of reference, rather than to the ordinary gravitational frame of reference. Thus, a top surface, a bottom surface, a front surface, a rear surface, a left surface, a right surface and a side surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A nanotube random access memory (NRAM) structure, comprising:
    a first substrate;
    a first gate electrode disposed in the first substrate;
    a first nanotube fabric disposed on the first substrate, the first nanotube fabric having a channel region spaced apart from the first gate electrode by a first portion of the first substrate;
    a first drain contact contacting the first nanotube fabric;
    a second nanotube fabric disposed on the first substrate and adjacent the first nanotube fabric, the second nanotube fabric connected to the first nanotube fabric; and
    a first source contact contacting the second nanotube fabric,
    wherein the first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

2. The NRAM structure of claim 1, wherein a thickness of the second nanotube fabric is less than a thickness of the first nanotube fabric, or a width of the second nanotube fabric is less than a width of the first nanotube fabric.

3. The NRAM structure of claim 1, wherein the first drain contact and the first source contact are disposed in the first substrate.

4. The NRAM structure of claim 2, further comprising a first bridge contact disposed in the first substrate and contacting the first nanotube fabric and the second nanotube fabric.

5. The NRAM structure of claim 2, further comprising:
    a second substrate disposed on or over the first nanotube fabric and the second nanotube fabric;
    a second gate electrode disposed in the second substrate, wherein the channel region is spaced apart from the second gate electrode by a first portion of the second substrate;
    a second drain contact disposed in the second substrate and contacting the first nanotube fabric; and
    a second source contact disposed in the second substrate and contacting the second nanotube fabric,
    wherein when a voltage is applied across the first nanotube fabric and the second nanotube fabric via the second drain contact and the second source contact, the second nanotube fabric is permitted to switch without switching the first nanotube fabric.

6. The NRAM structure of claim 5, wherein a cavity is defined in the second substrate over the second nanotube fabric.

7. The NRAM structure of claim 5, further comprising:
    a first bridge contact disposed in the first substrate and contacting the first nanotube fabric and the second nanotube fabric; and
    a second bridge contact disposed in the second substrate and contacting the first nanotube fabric and the second nanotube fabric.

8. The NRAM structure of claim 5, wherein the second substrate comprises:
    a silicon nitride layer on or over the first nanotube fabric and the second nanotube fabric; and
    a silicon dioxide layer disposed on the silicon nitride layer.

9. The NRAM structure of claim 5, further comprising:
    a third nanotube fabric disposed on the second substrate, the third nanotube fabric having a channel region;
    a fourth nanotube fabric disposed on the second substrate and adjacent the third nanotube fabric;
    a third substrate disposed on or over the third nanotube fabric and the fourth nanotube fabric;
    a third gate electrode disposed in the third substrate, wherein the channel region of the third nanotube fabric is spaced apart from the third gate electrode by a first portion of the third substrate;
    a third drain contact disposed in the third substrate and contacting the third nanotube fabric; and
    a third source contact disposed in the third substrate and contacting the fourth nanotube fabric,
    wherein a thickness of the fourth nanotube fabric is less than a thickness of the third nanotube fabric or a width of the fourth nanotube fabric is less than a width of the third nanotube fabric such that when a voltage is applied across the third nanotube fabric and the fourth nanotube fabric via the third drain contact and the third source contact, the fourth nanotube fabric is permitted to switch without switching the third nanotube fabric.

10. The NRAM structure of claim 9, wherein a cavity is defined in the third substrate over the fourth nanotube fabric.

11. The NRAM structure of claim 9, further comprising a third bridge contact disposed in the third substrate and contacting the third nanotube fabric and the fourth nanotube fabric.

12. The NRAM structure of claim 1, further comprising a first bridge contact disposed on the first nanotube fabric and the second nanotube fabric, wherein the first bridge contact comprises a portion aligned with a portion of the first gate electrode, and wherein the first drain contact is disposed on the first nanotube fabric and comprises a portion aligned with a portion of the first gate electrode.

13. The NRAM structure of claim 1, wherein at least 50% of nanotubes in at least one of the first nanotube fabric and the second nanotube fabric are substantially aligned.

14. The NRAM structure of claim 1, further comprising:
    a second substrate on or over the first nanotube fabric and the second nanotube fabric;
    a third nanotube fabric disposed on the second substrate, the third nanotube fabric having a channel region;
    a fourth nanotube fabric disposed on the second substrate and adjacent the third nanotube fabric;
    a third substrate on or over the third nanotube fabric and the fourth nanotube fabric;
    a second gate electrode disposed in the third substrate, wherein the channel region of the third nanotube fabric is spaced apart from the second gate electrode by a first portion of the third substrate;
    a second drain contact disposed in the third substrate and contacting the third nanotube fabric; and
    a second source contact disposed in the third substrate and contacting the fourth nanotube fabric,
    wherein a thickness of the fourth nanotube fabric is less than a thickness of the third nanotube fabric or a width of the fourth nanotube fabric is less than a width of the third nanotube fabric such that when a voltage is applied across the third nanotube fabric and the fourth nanotube fabric via the second drain contact and the second source contact, the fourth nanotube fabric is permitted to switch without switching the third nanotube fabric.

15. The NRAM structure of claim 14, wherein the first source contact and the second source contact are connected to form a read line, and wherein the first drain contact and the second drain contact are connected to form a bit line.

16. The NRAM structure of claim 1, wherein an amount of metallic nanotubes in the channel region of the first nanotube fabric is less than an amount of metallic nanotubes in a second region of the first nanotube fabric, wherein the second region is outside the channel region.

17. A method for forming a nanotube random access memory (NRAM) structure, the method comprising:
  providing a first substrate;
  providing a first drain contact;
  providing a first source contact,
  providing a first gate electrode, wherein the first gate electrode is disposed in the first substrate;
  providing a first nanotube fabric disposed on the first substrate and connected to the first drain contact; and
  providing a second nanotube fabric, wherein the second nanotube fabric is disposed on the first substrate and adjacent the first nanotube fabric, the second nanotube fabric connected to the first nanotube fabric and connected to the first source contact,
  wherein the first nanotube fabric is a high-voltage fabric compared to the second nanotube fabric such that when a voltage is applied across the first nanotube fabric and the second nanotube fabric via the first drain contact and the first source contact, the second nanotube fabric is permitted to switch without switching the first nanotube fabric.

18. The method of claim 17, further comprising:
  creating a channel region within the first nanotube fabric by removing metallic nanotubes from the first nanotube fabric,
  wherein the channel region is spaced apart from the first gate electrode by a first portion of the first substrate.

19. The method of claim 18, wherein the metallic nanotubes from the first nanotube fabric are removed by:
  placing the first nanotube fabric in an environment, the environment having a temperature between 400° Celsius and 800° Celsius;
  introducing a hydrogen containing gas into the environment;
  exposing the channel region to plasma; and
  annealing the channel region,
  wherein after the metallic nanotubes from the first nanotube fabric are removed, an $I_{on}/I_{off}$ ratio of the first nanotube fabric is between 10,000/1 and 1,500,000/1.

20. A method for operating a nanotube random access memory (NRAM) structure, the method comprising:
  applying a voltage to a first gate electrode disposed in a first substrate of the NRAM structure to increase conduction in a channel region, wherein the channel region is in a first nanotube fabric disposed on the first substrate, wherein the channel region is spaced apart from the first gate electrode by a first portion of the first substrate, wherein a second nanotube fabric is disposed on the first substrate, and wherein the second nanotube fabric is adjacent to and connected to the first nanotube fabric; and
  applying a voltage across the first nanotube fabric and the second nanotube fabric via a first drain contact contacting the first nanotube fabric and a first source contact contacting the second nanotube fabric such that the second nanotube fabric is switched without switching the first nanotube fabric.

21. The method of claim 20, further comprising measuring current flowing through the second nanotube fabric for determining a state of the second nanotube fabric.

* * * * *